(12) United States Patent
Han et al.

(10) Patent No.: US 11,199,924 B2
(45) Date of Patent: Dec. 14, 2021

(54) ELECTRONIC DEVICE INCLUDING DECORATION STRUCTURE

(71) Applicants: SAMSUNG ELECTRONICS CO., LTD., Suwon-si (KR); WONJIN INDUSTRY CO., LTD., Ansan-si (KR)

(72) Inventors: Seung-Soo Han, Seoul (KR); In-Sik Yang, Suwon-si (KR)

(73) Assignees: SAMSUNG ELECTRONICS CO., LTD., Suwon-si (KR); WONJIN INDUSTRY CO., LTD., Ansan-si (KR)

( * ) Notice: Subject to any disclaimer, the term of this patent is extended or adjusted under 35 U.S.C. 154(b) by 70 days.

(21) Appl. No.: 16/497,211

(22) PCT Filed: Mar. 23, 2018

(86) PCT No.: PCT/KR2018/003475
§ 371 (c)(1),
(2) Date: Sep. 24, 2019

(87) PCT Pub. No.: WO2018/174658
PCT Pub. Date: Sep. 27, 2018

(65) Prior Publication Data
US 2021/0089160 A1 Mar. 25, 2021

(30) Foreign Application Priority Data
Mar. 24, 2017 (KR) ........................ 10-2017-0037714

(51) Int. Cl.
*G06F 3/041* (2006.01)
*G06F 3/0488* (2013.01)
*H04M 1/02* (2006.01)

(52) U.S. Cl.
CPC ........ *G06F 3/0416* (2013.01); *G06F 3/04883* (2013.01); *G06F 3/04886* (2013.01); *H04M 1/0202* (2013.01)

(58) Field of Classification Search
CPC ... H04M 1/0202; H04M 1/02; G06F 3/04886; G06F 3/041; G06F 3/04883;
(Continued)

(56) References Cited

U.S. PATENT DOCUMENTS

| 2012/0147534 A1 | 6/2012 | Liang |
| 2014/0140533 A1 | 5/2014 | Malek et al. |

(Continued)

FOREIGN PATENT DOCUMENTS

| JP | 2012-070188 | 4/2012 |
| KR | 10-2012-0128975 | 11/2012 |

(Continued)

OTHER PUBLICATIONS

International Search Report for PCT/KR2018/003475 dated Jul. 2, 2018, 4 pages with English Translation.

(Continued)

*Primary Examiner* — Yaron Cohen
(74) *Attorney, Agent, or Firm* — Nixon & Vanderhye, P.c.

(57) ABSTRACT

According to various embodiments of the present invention, a decoration structure included in an electronic device may be enhanced, wherein the decoration structure comprises: a first member comprising a second projecting portion formed with a plurality of through holes and a first planar portion formed with at least one coupling hole; and a second member supporting the first member and comprising at least one coupling portion inserted into the at least one coupling hole, wherein the at least one coupling portion is bent while being inserted into the at least one coupling hole, so that the first member and the second member can be coupled to each other. Various other embodiments may be possible.

4 Claims, 18 Drawing Sheets

(58) Field of Classification Search
CPC .... G06F 3/0416; G06F 1/1688; G06F 1/1684; G06F 1/1626; G06F 1/1656; G06F 1/181; H05K 5/00
See application file for complete search history.

(56) References Cited

U.S. PATENT DOCUMENTS

2016/0073194 A1* 3/2016 Auclair ................. H04R 1/023
　　　　　　　　　　　　　　　　　　　　　　381/345
2016/0088385 A1　 3/2016 Fan et al.

FOREIGN PATENT DOCUMENTS

| KR | 10-2015-0082043 | 7/2015 |
| KR | 10-2016-0007601 | 1/2016 |

OTHER PUBLICATIONS

Written Opinion of the ISA for PCT/KR2018/003475 dated Jul. 2, 2018, 14 pages with English Translation.

* cited by examiner

US 11,199,924 B2

ELECTRONIC DEVICE INCLUDING DECORATION STRUCTURE

DECORATION STRUCTURE AND ELECTRONIC DEVICE INCLUDING SAME

This application is a National Phase Entry of PCT International Application No. PCT/KR2018/003475, which was filed on Mar. 23, 2018, designating the United States, and claims priority under 35 U.S.C. § 119 of the Korean Patent Application No. 10-2017-0037714 filed on Mar. 24, 2017 in the Republic of Korea, the disclosures of each which is incorporated herein by reference in its entirety.

Field

Various embodiments of the disclosure relate to a decoration structure and an electronic device including the same.

Description of Related Art

Electronic devices refer to devices that perform particular functions based on embedded programs, such as home appliances, electronic notes, portable multimedia players (PMPs), and mobile communication terminals, tablet personal computers (PCs), video/audio devices, desktop/laptop computers, vehicle navigation systems, and so forth. For example, these electronic devices may output stored information in the form of texts, sound, images, and so forth. With the increasing integration of electronic devices and the common use of ultra-high-speed and large-volume wireless communication, various functions have been recently provided through a single mobile communication terminal. For example, an entertainment function such as games, a multimedia function such as music/video playback, a communication and security function for mobile banking, and a function such as schedule management, electronic wallets, or the like, as well as a communication function have been integrated into a single electronic device.

A mobile communication terminal, which is one of electronic devices, may include an audio component that outputs sound and a plurality of through-holes that emit the sound output from the audio component to the outside.

Summary

The plurality of through-holes may be implemented with a mesh material to which a reinforcement material is attached to secure rigidity of the mesh. When the reinforcement material is attached to the mesh material by using an adhesive member (e.g., a double-sided tape), an assembly tolerance may be generated in the course of assembly of the mesh material, the reinforcement material, and the adhesive member, degrading the quality of a product, increasing a manufacturing cost due to use of the adhesive member, and increasing the thickness of the product as much as the thickness of the adhesive member (e.g., the double-sided tape).

A decoration structure included in an electronic device according to various embodiments of the disclosure may couple a mesh material with a reinforcement material without using an adhesive member (e.g., a double-sided tape).

An electronic device according to various embodiments of the disclosure include a housing including a first plate, a second plate facing away from the first plate, and a side member surrounding a space between the first plate and the second plate, the side member being attached to or formed integrally with the second plate, a touch screen display exposed through the first plate, an audio component arranged between the first plate and the second plate and connecting sound to outside the housing through an opening formed in the first plate close to the touch screen display when viewed from above the first plate, a decoration structure including a first plane portion interposed between the audio component and the first plate and a second protruding portion protruding from a middle region of the first plane portion to fill the opening and formed integrally with the first plane portion, in which the second protruding portion includes an upper portion that is parallel with the first plate and a side portion that is substantially perpendicular to the upper portion, and the second protruding portion is connected with the first plane portion, and the upper portion includes a lattice structure including a plurality of through-holes and the side portion does not include a lattice structure, a wireless communication circuit arranged inside the housing, and a processor electrically connecting the touch screen display, the audio component, and the wireless communication circuit.

A decoration structure included in an electronic device according to various embodiments of the disclosure includes a first plane portion, a second protruding portion connected with the first plane portion and protruding from a surface of the first plane portion, and a plurality of through-holes formed on a front surface of the second protruding portion in which a through-hole is not formed in a side of the second protruding portion.

A decoration structure included in an electronic device according to various embodiments of the disclosure includes a first member including a second protruding portion in which a plurality of through-holes are formed and a first plane portion in which at least one coupling hole is formed and a second member supporting the first member and including at least one coupling portion inserted into the at least one coupling hole, in which the at least one coupling portion is bent while being inserted into the at least one coupling hole to couple the first member with the second member.

A decoration structure included in an electronic device according to various embodiments of the disclosure may couple a first member in which a plurality of through-holes are formed with a second member by using a coupling portion, thereby avoiding using an adhesive member (e.g., a double-sided tape), preventing the quality of a product from being degraded and reducing a manufacturing cost.

DETAILED DESCRIPTION OF EXAMPLE EMBODIMENTS

Figure 1:
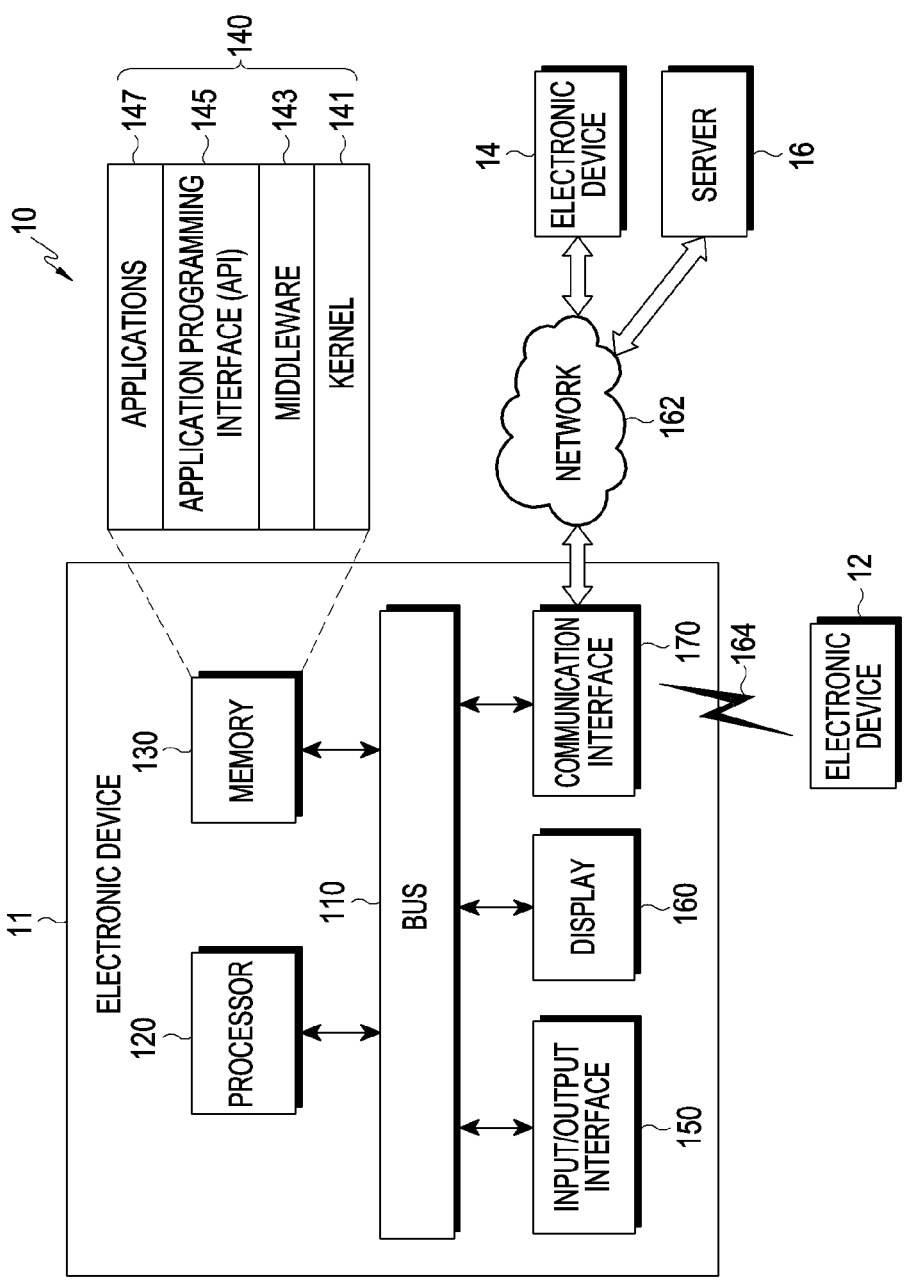
FIG. 1 is a schematic block diagram of an electronic device in a network environment according to various embodiments of the disclosure.

Hereinafter, various embodiments of the disclosure will be disclosed with reference to the accompanying drawings. However, embodiments and terms used therein are not intended to limit the present disclosure to particular embodiments, and it should be construed as including various modifications, equivalents, or alternatives according to the embodiments of the present disclosure. With regard to the description of the drawings, similar reference numerals may be used to refer to similar or related elements. It is to be understood that a singular form of a noun corresponding to an item may include one or more of the things, unless the relevant context clearly indicates otherwise. In the present disclosure, an expression such as "A or B," "at least one of A or/and B," or "one or more of A or B" may include all possible combinations of together listed items. Expressions such as "first," "second," "primarily," or "secondary," used herein may represent various elements regardless of order and/or importance and do not limit corresponding elements. When it is described that an element (such as a first element) is "operatively or communicatively coupled with/to" or "connected" to another element (such as a second element), the element can be directly connected to the other element or can be connected to the other element through another element (e.g., a third element).

In an embodiment, an expression "configured to (or set)" may be replaced with, for example, "suitable for," "having the capacity to," "adapted to," "made to," "capable of," or "designed to" according to a situation. Alternatively, in some situation, an expression "apparatus configured to" may mean that the apparatus "can" operate together with another apparatus or component. For example, a phrase "a processor configured (or set) to perform A, B, and C" may be a dedicated processor (e.g., an embedded processor) for performing a corresponding operation or a generic-purpose processor (such as a central processing unit (CPU) or an application processor) that can perform a corresponding operation by executing at least one software program stored at a memory device.

An electronic device according to various embodiments of the present disclosure may include at least one of, for example, a smartphone, a tablet personal computer (PC), a mobile phone, a video phone, an electronic-book (e-book) reader, a desktop PC, a laptop PC, a netbook computer, a workstation, a server, a personal digital assistant (PDA), a portable multimedia player (PMP), an MP3 player, a mobile medical equipment, a camera, or a wearable device. Examples of the wearable device may include at least one of an accessory type (e.g., a watch, a ring, a bracelet, an anklet, a necklace, glasses, contact lenses, head-mounted device (HMD), etc.), a fabric or cloth-integrated type (e.g., electronic clothing, etc.), a body-attached type (e.g., a skin pad, a tattoo, etc.), a body implantable circuit, or the like. In some embodiments, the electronic device may include, for example, at least one of a television (TV), a digital video disk (DVD) player, audio equipment, a refrigerator, an air conditioner, a vacuum cleaner, an oven, a microwave oven, a laundry machine, an air cleaner, a set-top box, a home automation control panel, a security control panel, a media box (e.g., Samsung HomeSync™, Apple TV™, or Google TV™), a game console (e.g., Xbox™ or PlayStation™), an electronic dictionary, an electronic key, a camcorder, or an electronic frame.

In other embodiments, the electronic device may include at least one of various medical equipment (e.g., various portable medical measurement devices (a blood glucose meter, a heart rate measuring device, a blood pressure measuring device, a body temperature measuring device, etc.), magnetic resonance angiography (MRA), magnetic resonance imaging (MRI), computed tomography (CT), an imaging device, or an ultrasonic device), a navigation system, a global navigation satellite system (GNSS), an event data recorder (EDR), a flight data recorder (FDR), a vehicle infotainment device, electronic equipment for ships (e.g., a navigation system and gyro compass for ships), avionics, a security device, a vehicle head unit, an industrial or home robot, an automatic teller's machine (ATM), a point of sales (POS), or an Internet of things device (e.g., electric bulbs, various sensors, electricity or gas meters, sprinkler devices, fire alarm devices, thermostats, streetlights, toasters, exercise machines, hot-water tanks, heaters, boilers, and so forth). According to some embodiments, the electronic device may include a part of furniture, a building/structure or a part of a vehicle, an electronic board, an electronic signature receiving device, a projector, and various measuring instruments (e.g., a water, electricity, gas, electric wave measuring device, etc.). According to various embodiments, the electronic device may be flexible or may be a combination of two or more of the above-described various devices. According to an embodiment of the disclosure, the electronic devices are not limited to those described above. In an embodiment, the term "user" used in various embodiments of the present disclosure may refer to a person who uses the electronic device or a device using the electronic device (e.g., an artificial intelligence electronic device).

FIG. 1 is a schematic block diagram of an electronic device in a network environment according to various embodiments of the disclosure.

Referring to FIG. 1, an electronic device 11 in a network environment 10 according to various embodiments of the present disclosure is disclosed. The electronic device 11 may include a bus 110, a processor 120, a memory 130, an input/output (I/O) interface 150, a display 160, and a communication interface 170. According to some embodiments, the electronic device 11 may omit at least one of the foregoing elements or may further include other elements. The bus 110 may include a circuit for connecting, e.g., the elements 110 to 170 and delivering communication (e.g., a control message or data) between the elements 110 to 170. The processor 120 may include one or more of a central processing unit (CPU), an application processor (AP), and a communication processor (CP). The processor 120 may perform operations or data processing for control or communication of, for example, at least one other elements of the electronic device 11.

The memory 130 may include a volatile or nonvolatile memory. The memory 130 may store, for example, instructions or data associated with at least one other elements of the electronic device 11. According to an embodiment, the memory 130 may store software or a program 140. The program 140 may include at least one of, for example, a kernel 141, middleware 143, an application programming interface (API) 145, or an application program (or "application") 147, and the like. At least some of the kernel 141, the middleware 143, and the API 145 may be referred to as an operating system (OS). The kernel 141 may control or manage, for example, system resources (e.g., the bus 110, the processor 120, the memory 130, etc.) used to execute operations or functions implemented in other programs (e.g., the middleware 143, the API 145, or the application program 147). The kernel 141 provides an interface through which the middleware 143, the API 145, or the application program 147 accesses separate components of the electronic device 11 to control or manage the system resources.

The middleware 143 may work as an intermediary for allowing, for example, the API 145 or the application program 147 to exchange data in communication with the kernel 141. In addition, the middleware 143 may process one or more task requests received from the application program 147 based on priorities. For example, the middleware 143 may give a priority for using a system resource (e.g., the bus 110, the processor 120, the memory 130, etc.) of the electronic device 11 to at least one of the application programs 147 and may process the one or more task requests. The API 145 is an interface used for the application 147 to control a function provided by the kernel 141 or the middleware 143, and may include, for example, at least one interface or function (e.g., an instruction) for file control, window control, image processing or character control. The I/O interface 150 may deliver, for example, an instruction or data input from a user or another external device to other component(s) of the electronic device 11 or output an instruction or data received from other component(s) of the electronic device 11 to a user or another external device.

The display 160 may include, for example, a liquid crystal display (LCD), a light emitting diode (LED) display, an organic light emitting diode (OLED) display, a microelectromechanical system (MEMS) display, an electronic paper display, and a touch screen display. The display 160 may, for example, display various contents (e.g., a text, an image, a video, an icon, a symbol, etc.) to users. The display 160 may include a touch screen, and receives a touch, a gesture, proximity, or a hovering input, for example, by using an electronic pen or a part of a body of a user.

The communication interface 170 establishes communication between the electronic device 11 and an external device (e.g., the vehicle device 12, the electronic device 14, or the server 16). For example, the communication interface 170 may be connected to a network 162 through a wireless communication or wired communication to communicate with an external device (e.g., the second external electronic device 14 or the server 16. A wireless communication circuit may include the communication interface 170.

The wireless communication may include cellular communication using at least one of Long Term Evolution (LTE), LTE-Advanced (LTE-A), Code Division Multiple Access (CDMA), Wideband CDMA (WCDMA), a Universal Mobile Telecommunication System (UMTS), Wireless Broadband (WiBro), or Global System for Mobile Communications (GSM)). According to an embodiment, the wireless communication may include at least one of Wireless Fidelity (WiFi), Bluetooth, Bluetooth Low Energy (BLE), Zigbee, near field communication (NFC), magnetic secure transmission (MST), radio frequency (RF), or a body area network (BAN), as illustrated as an element 164 in FIG. 1. According to an embodiment, the wireless communication may include a global navigation satellite system (GNSS). The GNSS may include, for example, at least one of a global positioning system (GPS), a global navigation satellite system (Glonass), a Beidou navigation satellite system ("Beidou"), or Galileo, the European global satellite-based navigation system. In an embodiment, "GPS" may be used interchangeably with "GNSS". The wired communication may include, for example, at least one of a universal serial bus (USB), a high definition multimedia interface (HDMI), Recommended Standard 232 (RS-232), power line communication, a plain old telephone service (POTS), or the like. The network 162 may include a telecommunications network, for example, at least one of a computer network (e.g., a local area network (LAN) or a wide area network (WAN)), Internet, or a telephone network.

Each of the first external electronic device 12 and the second external electronic device 14 may be a device of the same type as or a different type than the electronic device 11. According to various embodiments of the present disclosure, some or all of operations performed by the electronic device 11 may be performed in another electronic device or a plurality of electronic devices (e.g., the electronic device 12 or 14 or the server 16). According to an embodiment of the present disclosure, when the electronic device 11 has to perform a function or a service automatically or at a request, the electronic device 11 may request another device (e.g., the electronic devices 12 or 14 or the server 16) to perform at least some functions associated with the function or the service instead of or in addition to executing the function or the service. The another electronic device (e.g., the electronic device 12 or 14 or the server 16) may execute the requested function or additional function and deliver the execution result to the electronic device 11. The electronic device 11 may then process or further process the received result to provide the requested function or service. To that end, a cloud computing, distributed computing, or client-server computing technology may be used, for example.

Figure 2:
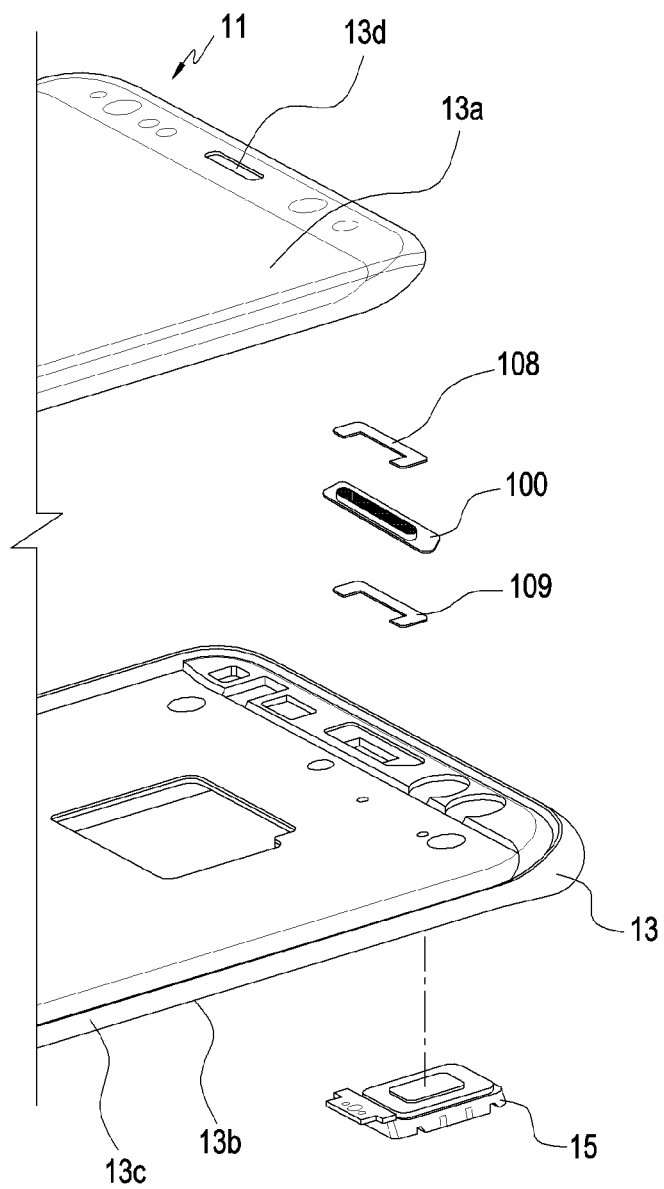
FIG. 2 is an exploded perspective view illustrating an electronic device according to one of various embodiments of the disclosure.

FIG. 2 is an exploded perspective view illustrating an electronic device (e.g., the electronic device 11 of FIG. 1) according to one of various embodiments of the disclosure.

Referring to FIG. 2, an electronic device 11 according to one of various embodiments of the disclosure may include a housing 13, an audio component 15, and a decoration structure 100.

According to an embodiment of the disclosure, the housing 13 may include a first plate 13a, a second plate 13b, and a side member 13c. The first plate 13a may protect an inside of the housing 13 while forming a surface of the housing 13. The first plate 13a may be manufactured using glass, synthetic resin (e.g., acryl or polycarbonate), etc., to implement a screen output from a touch screen display (e.g., the display 160 of FIG. 1). For example, the touch screen display (e.g., the display 160 of FIG. 1) may be exposed through the first plate 13a. According to an embodiment of the disclosure, at least a portion, e.g., opposite side ends, of the first plate 13a forms a curved surface, thus having a stereoscopic shape. The second plate 13b may be directed opposite to the first plate 13a. The side member 13c may surround a space between the first plate 13a and the second plate 13b. For example, the housing 13 may provide a space for accommodating a structure for arranging various input/output devices, etc., and/or a circuit device, etc., such as a processor or the like, and may be at least partially manufactured using an electrically conductive material. According to an embodiment of the disclosure, the housing 13 including a conductive material may be used as an antenna radiator.

According to an embodiment of the disclosure, the audio component 15 may be mounted inside the housing 13 and output sound. The audio component 15 may include a vibration plate for generating sound and magnets for vibrating the vibration plate. According to an embodiment of the disclosure, the audio component 15 may be a microphone that senses external sound as well as output sound.

According to an embodiment of the disclosure, the decoration structure 100 may be mounted inside the housing 13. A portion of the decoration structure 100 may be exposed to outside the housing 13 through an opening 13d formed in the first plate 13a. The decoration structure 100 may be connected with the audio component 15 to provide a path for emitting sound generated from the audio component 15 to outside. According to an embodiment of the disclosure, when the audio component 15 is a microphone, the decoration structure 100 may provide a path for introducing sound generated from outside the housing 13 to inside the housing 13. According to an embodiment of the disclosure, the decoration structure 100 may be connected with a sensor (e.g., a gas sensor) mounted inside the housing 13 to provide a path for introducing gas, odor, etc., generated from outside the housing 13 to inside the housing 13. According to an embodiment of the disclosure, the decoration structure 100 may be connected with a fan (e.g., an air blower) mounted inside the housing 13 to provide a path for discharging air inside the housing 13 to outside the housing 13 through the fan.

According to an embodiment of the disclosure, the decoration structure 100 may include a protection member 108 and an attachment member 109. The protection member 108 may be arranged between the first plate 13a and the decoration structure 100 to prevent the first plate 13a from being damaged by the decoration structure 100 or the decoration structure 100 from being damaged by the first plate 13a. The attachment member 109 may attach the decoration structure 100 to the second plate 13b.

Figure 3:
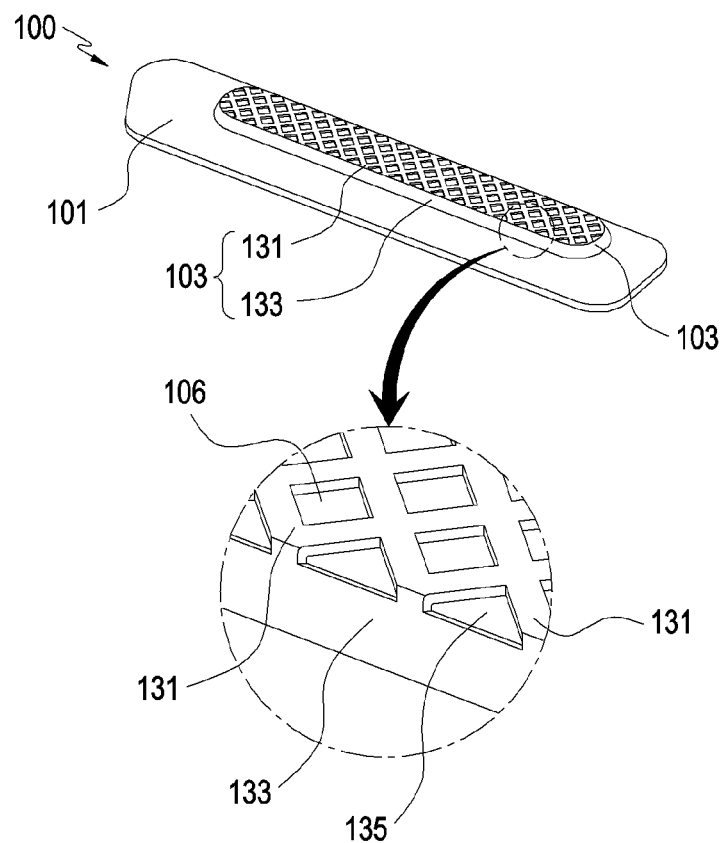
FIG. 3 is a perspective view illustrating a decoration structure included in an electronic device, according to one of various embodiments of the disclosure.
Figure 4:
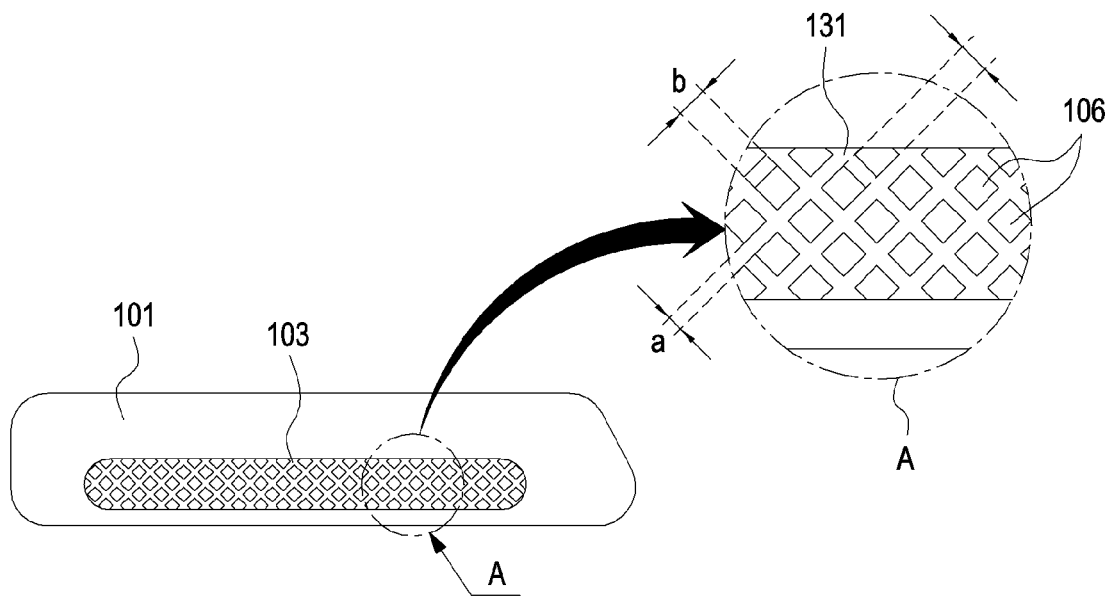
FIG. 4 is a plane view illustrating a decoration structure included in an electronic device, according to one of various embodiments of the disclosure.

FIG. 3 is a perspective view illustrating a decoration structure (e.g., the decoration structure 100 of FIG. 2) included in an electronic device (e.g., the electronic device 11 of FIG. 2), according to one of various embodiments of the present disclosure. FIG. 4 is a plane view illustrating a decoration structure included in an electronic device, according to one of various embodiments of the disclosure.

Referring to FIGS. 3 and 4, the decoration structure 100 included in an electronic device according to one of various embodiments of the disclosure may include a first plane portion 101, a second protruding portion 103, and a plurality of through-holes 106.

According to an embodiment of the disclosure, the first plane portion 101 may have a plate shape. The first plane portion 101 may be interposed between the audio component (e.g., the audio component 15 of FIG. 2) and the first plate (e.g., the first plate 13a of FIG. 2). According to an embodiment of the disclosure, the first plane portion 101 may be interposed between the first plate (e.g., the first plate 13a of FIG. 2) and the second plate (e.g., the first plate 13b of FIG. 2). According to an embodiment of the disclosure, a portion of the first plane part 101 may be connected to a side of a duct connected with the audio component (e.g., the audio component 15 of FIG. 2). The first plane portion 101 may include a metal material. The metal material of the first plane portion 101 may include at least one of aluminum (Al). According to an embodiment of the disclosure, the metal material may include various materials that have rigidity and strong corrosion resistance, such as stainless steel (STS), without being limited to aluminum.

According to an embodiment of the disclosure, the second protruding portion 103 may protrude from a portion (e.g., a middle region) of the first plane portion 101. The second protruding portion 103 may include the same metal material as that of the first plane portion 101. The second protruding portion 103 may include a front surface (e.g., an upper portion) 131 and a side (e.g., a side portion) 133. The front surface 131 may correspond to a shape of the first plate (e.g., the first plate 13a of FIG. 2). For example, when a portion of the first plate (e.g., the first plate 13a of FIG. 2) forms a curved surface, the front surface 131 may have a curved surface to correspond to the portion of the first plate (e.g., the first plate 13a of FIG. 2). The side 133 may be substantially perpendicular to the front surface 131. The second protruding portion 103 may be inserted into the opening (e.g., the opening 13d of FIG. 2) while having a shape corresponding to the opening (e.g., the opening 13d of FIG. 2) of the first plate (e.g., the first plate 13a of FIG. 2).

According to an embodiment of the disclosure, the plurality of through-holes 106 may be formed in the front surface 131 of the second protruding portion 103. The front surface 131 of the second protruding portion may have a lattice structure or a mesh form, such that the plurality of through-holes 106 may be formed in the front surface 131. The plurality of through-holes 106 may have a rectangular shape. The front surface 131 of the second protruding portion may have a lattice structure having a first width a. According to an embodiment of the disclosure, the first width a may range from about 0.05 mm to about 1 mm. According to an embodiment of the disclosure, the plurality of through-holes 106 may have a second width b. According to an embodiment of the disclosure, the second width b may range from about 0.05 mm to about 2 mm. According to an embodiment of the disclosure, the second width b may be greater than the first width a. According to an embodiment of the disclosure, the plurality of through-holes 106 may have any one of a circular shape, a square shape, rectangular shape, or a rhombus shape. The side 133 may not include a lattice structure. For example, a through-hole may not be formed in the side 133.

According to an embodiment of the disclosure, a side of the lattice structure may be exposed to an upper portion of the side 133. For example, a plurality of recessed portions 135 are formed in an edge of the front surface 131, such that the plurality of recessed portions 135 may be exposed to an uppermost portion of the side 133. The plurality of recessed portions 135 may surround the plurality of through-holes 106. According to an embodiment of the disclosure, the plurality of recessed portions 135 may pass through a portion of the front surface 131.

Figure 5:
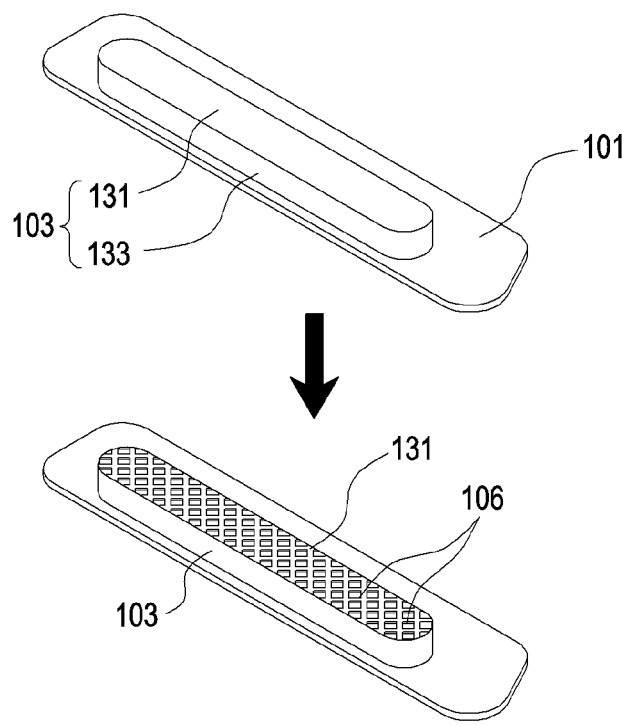
FIG. 5 is a perspective view showing a process in which a plurality of through-holes are formed in a decoration structure included in an electronic device, according to one of various embodiments of the disclosure.

FIG. 5 is a perspective view illustrating a process in which a plurality of through-holes are formed in a decoration structure (e.g., the decoration structure 100 of FIG. 3) included in an electronic device (e.g., the electronic device 11 of FIG. 2), according to one of various embodiments of the disclosure.

Referring to FIG. 5, the decoration structure (e.g., the decoration structure 100 of FIG. 3) may include the second protruding portion 103 that protrudes from a surface of the first plane portion 101.

Referring to FIG. 5, the front surface 131 of the second protruding portion 103 may be subject to first laser processing by a laser along a first direction, such that a first portion of the second protruding portion 103 may be removed. According to an embodiment of the disclosure, the first direction may be a diagonal direction with respect to an edge of the second protruding portion 103, when viewed from above the front surface 131 of the second protruding portion 103. The front surface 131 of the second protruding portion 103 may be subject to second laser processing by a laser along a second direction intersecting the first direction, such that a second portion of the second protruding portion 103 may be removed. According to an embodiment of the disclosure, the second direction may be a diagonal direction with respect to the edge of the second protruding portion 103, when viewed above the front surface 131 of the second protruding portion 103. In the front surface 131 of the second protruding portion 103, the plurality of through-holes 106 may be formed in a region where the first portion and the second portion removed by the laser intersect. The front surface 131 of the second protruding portion may have a lattice structure having a first width (e.g., the first width a of FIG. 4). According to an embodiment of the disclosure, the first width (e.g., the first width a of FIG. 4) may range from about 0.05 mm to about 1 mm. According to an embodiment of the disclosure, the plurality of through-holes (e.g., the through-holes 106 of FIG. 4) may have a second width (e.g., the second width b of FIG. 4). According to an embodiment of the disclosure, the second width (e.g., the second width b of FIG. 4) may range from about 0.05 mm to about 2 mm. According to an embodiment of the disclosure, the second width b may be greater than the first width a. As the plurality of through-holes 106 are formed in the front surface 131 of the second protruding portion 103 by the laser without being formed in the side of the second protruding portion 103 and the surface of the first plane portion 101, the rigidity of the side of the second protruding portion 103 and the first plane portion 101 may be secured. According to an embodiment of the disclosure, the plurality of through-holes 106 may be formed in the front surface of the second protruding portion 103, by punching as well as processing using a laser.

Figure 6:
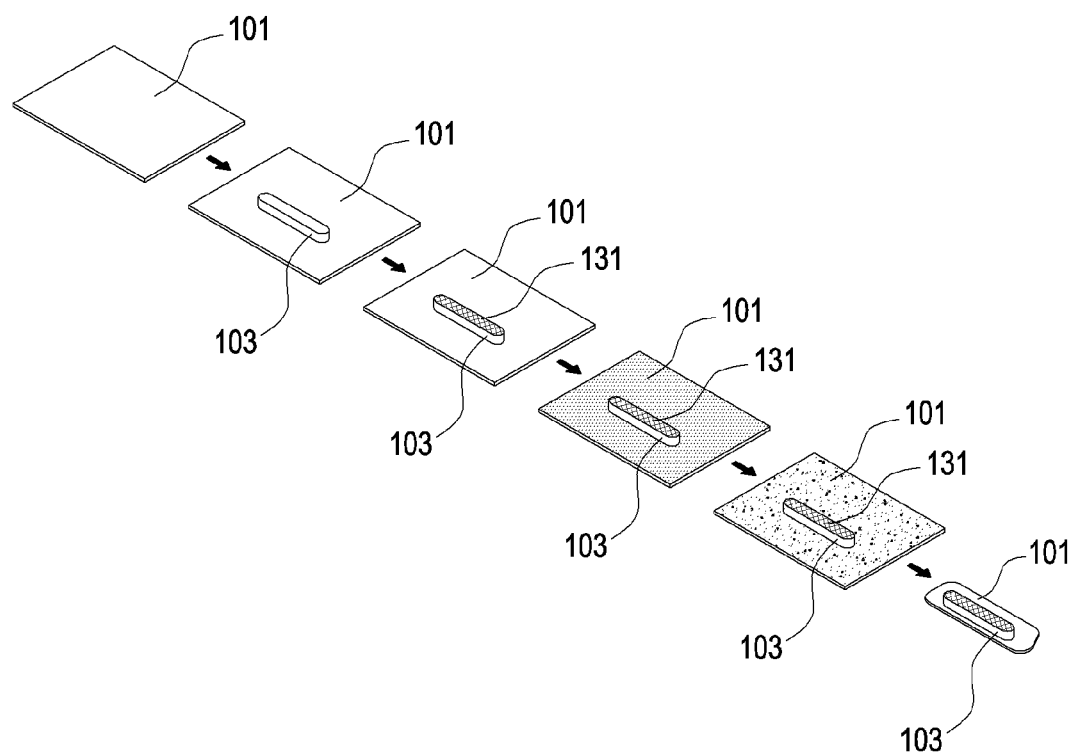
FIG. 6 is a perspective view illustrating a method of manufacturing a decoration structure included in an electronic device, according to one of various embodiments of the disclosure.
Figure 7:
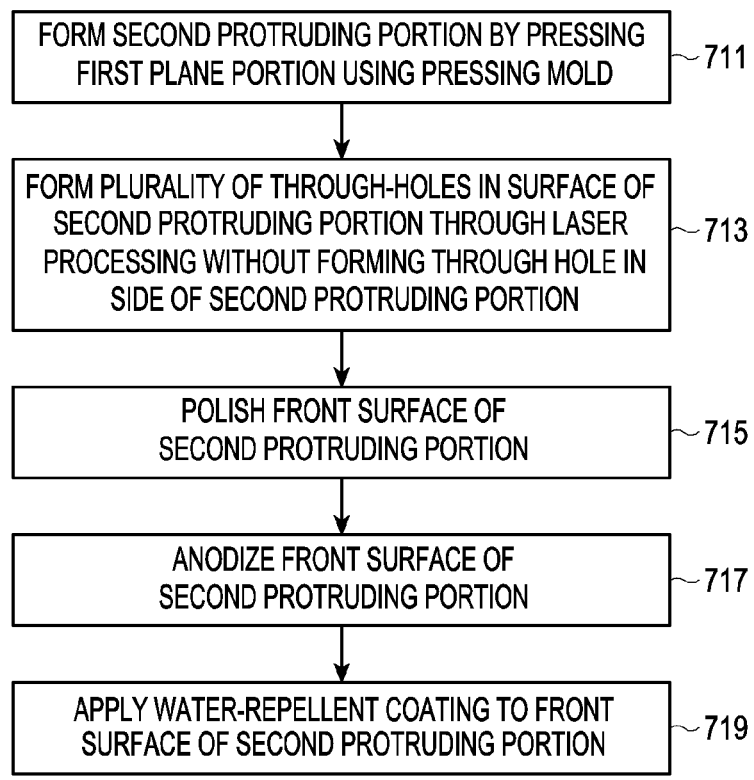
FIG. 7 is a flowchart illustrating a method of manufacturing a decoration structure included in an electronic device, according to one of various embodiments of the disclosure.

FIG. 6 is a perspective view illustrating a method of manufacturing a decoration structure included in an electronic device, according to one of various embodiments of the disclosure. FIG. 7 is a flowchart illustrating a method of manufacturing a decoration structure included in an electronic device, according to one of various embodiments of the disclosure.

Referring to FIGS. 6 and 7, a method of manufacturing a decoration structure included in an electronic device according to various embodiments of the disclosure may include operation 711 of providing the first plane portion 101, operation 713 of forming the second protruding portion 103 by pressing the first plane portion 101, operation 715 of forming a plurality of through-holes (e.g., the plurality of through-holes 106 of FIG. 5) in the front surface 131 of the second protruding portion 103 through laser processing without forming a through-hole in the side of the second protruding portion 103, operation 717 of polishing the front surface 131 of the second protruding portion, operation 719 of anodizing the front surface 131 of the second protruding portion, operation 721 of performing water-repellent coating to the front surface 131 of the second protruding portion, and operation 723 of cutting a portion of the first plane portion 101.

According to an embodiment of the disclosure, in operation 711 of providing the first plane portion 101, the first plane portion 101 having a plate shape may be provided as shown in FIG. 6.

According to an embodiment of the disclosure, operation 713 of forming the second protruding portion 103 by pressing the first plane portion 101 may include additionally processing the side (e.g., the side 133 of FIG. 3) of the second protruding portion 103 through computer numerical control (CNC).

According to an embodiment of the disclosure, operation 715 of forming a plurality of through-holes (e.g., the plurality of through-holes 106 of FIG. 5) in the front surface 131 of the second protruding portion 103 through laser processing may include forming a recessed portion (e.g., the recessed portion 135 of FIG. 3) in an edge of the front surface 131 of the second protruding portion 103.

According to an embodiment of the disclosure, operation 717 of polishing the front surface 131 of the second protruding portion may include polishing the front surface 131 by rotating a buff. According to an embodiment of the disclosure, operation 717 of polishing the front surface 131 may use various polishing tools, etc., without being limited to polishing using a buff.

According to an embodiment of the disclosure, operation 719 of anodizing the front surface 131 of the second protruding portion 103 may implement a color and a gloss on the front surface 131 through the anodizing.

According to an embodiment of the disclosure, operation 721 of performing water-repellent coating on the front surface 131 of the second protruding portion may include preventing a foreign substance (e.g., water, etc.) from being attached to the front surface 131 by coating the front surface 131 through spraying, nano-particle deposition, etc.

Figure 8:
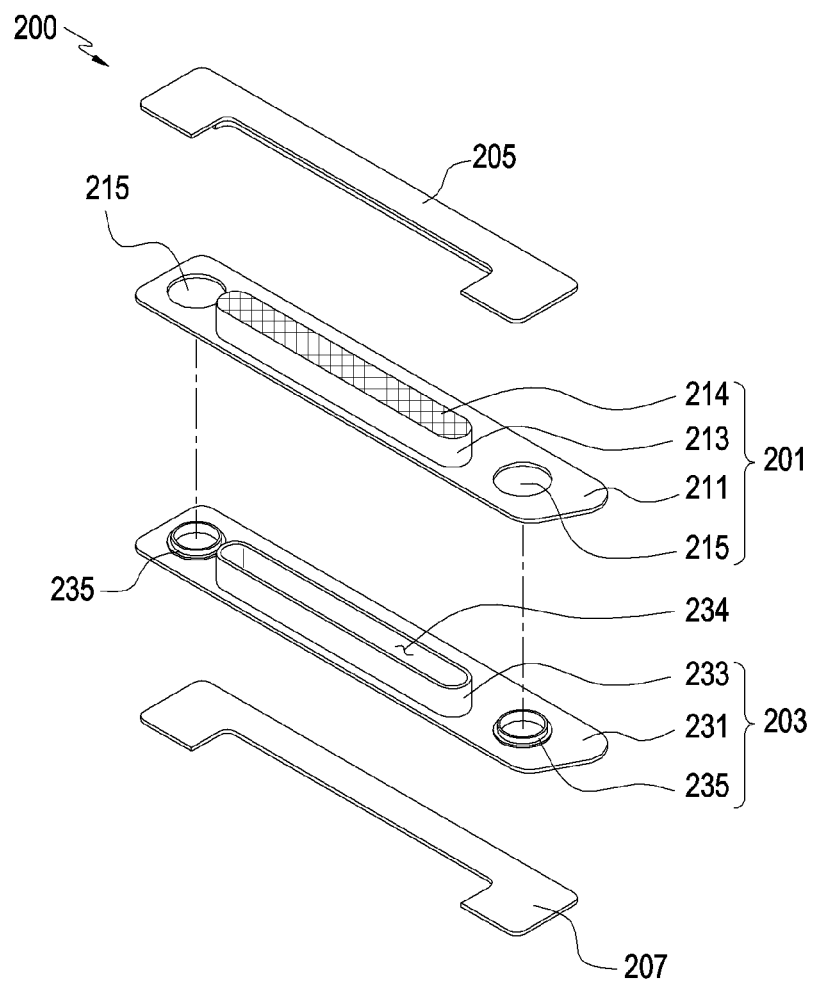
FIG. 8 is an exploded perspective view illustrating a decoration structure included in an electronic device, according to one of various embodiments of the disclosure.

FIG. 8 is an exploded perspective view illustrating a decoration structure included in an electronic device, according to one of various embodiments of the disclosure.

Referring to FIG. 8, a decoration structure 200 included in an electronic device (e.g., the electronic device 11 of FIG. 1) according to another one of various embodiments of the disclosure may include a first member 201, a second member 203, a protection member 205, and an adhesive member 207.

According to an embodiment of the disclosure, the first member 201 may include a first plane portion 211 and a second protruding portion 213. In the first plane portion 211, at least one coupling hole 215 may be formed. The second protruding portion 213 may protrude from the first plane portion 211 while extending from the first plane portion 211. A plurality of through-holes may be formed in a front surface 214 of the second protruding portion 213. According to an embodiment of the disclosure, the plurality of through-holes may be formed in the first plane portion 211 and the side of the second protruding portion 213.

According to an embodiment of the disclosure, the second member 203 may reinforce the rigidity of the first member 201 while supporting the first member 201. The second member 203 may include aluminum, stainless steel, etc. The second member 203 may include a second plane portion 231 and a first protruding portion 233. The second plane portion 231 may have a shape corresponding to the first plane portion 211. The second plane portion 231 may include at least one coupling portion 235 which is inserted into the at least one coupling hole 215 while extending from the second plane portion 231. The first protruding portion 233 may protrude from the second plane portion 231 while extending from the second plane portion 231. The first plane portion 233 may have a shape corresponding to the second plane portion 213. The first protruding portion 213 may include a second through-hole 234 that is connected with a plurality of through-holes 234 formed in the first member 201.

According to an embodiment of the disclosure, the protection member 205 may cover a surface of the first member 201. The protection member 205 may be interposed between the first member 201 and the first plate (e.g., the first plate 12*a* of FIG. 2) of the housing. The protection member 205 may have a sponge form. The protection member 205 may prevent a bottom surface of the first plate (e.g., the first plate 12*a* of FIG. 2) from being damaged by a surface of the first member 201.

According to an embodiment of the disclosure, the adhesive member 207 may be attached to the second plate (e.g., the second plate 12*a* b of FIG. 2) of the second member 203. For example, the adhesive member 207 may be a double-sided tape. The adhesive member 207 may be arranged between the second member 203 and a second plate (e.g., the second plate 12*b* of FIG. 2) of the housing to attach the second member to the second plate (e.g., the second plate 12*b* of FIG. 2).

Figure 9:
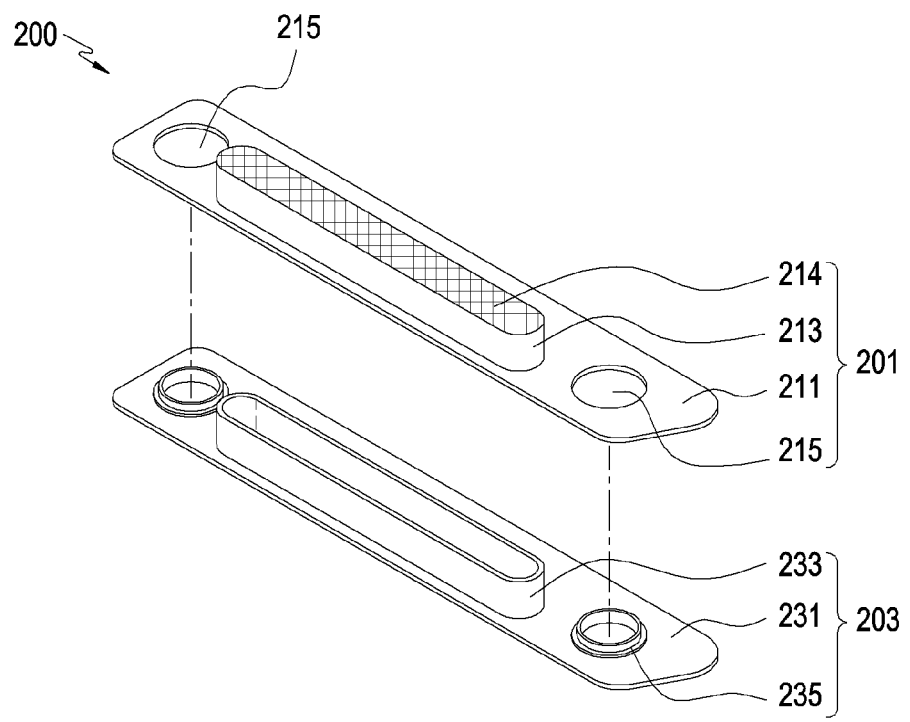
FIG. 9 is a perspective view showing a state before a first member and a second member of a decoration structure included in an electronic device are coupled, according to another one of various embodiments of the disclosure.
Figure 10:
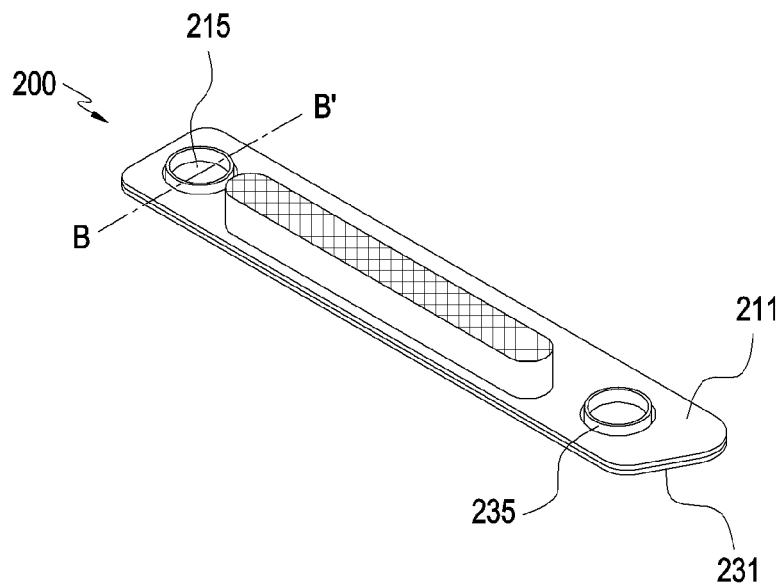
FIG. 10 is a perspective view showing a state in which a first member and a second member of a decoration structure included in an electronic device are coupled, according to another one of various embodiments of the disclosure.
Figure 11:
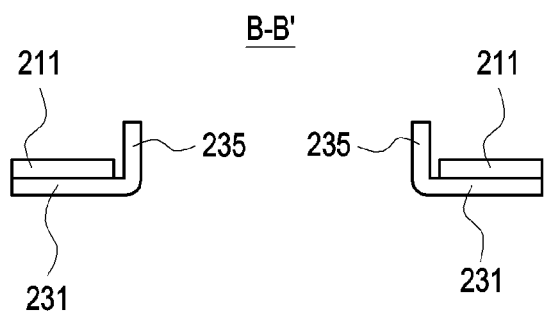
FIG. 11 is a cross-sectional view cut along a line B-B' of FIG. 10.

FIG. 9 is a perspective view showing a state before a first member and a second member of a decoration structure included in an electronic device are coupled according to another one of various embodiments of the disclosure. FIG. 10 is a perspective view showing a state in which a first member and a second member of a decoration structure included in an electronic device are coupled, according to another one of various embodiments of the disclosure. FIG. 11 is a cross-sectional view cut along a line B-B' of FIG. 10.

Referring to FIGS. 9 and 10, the first member 201 of the decoration structure 200 may be settled on the second member 203. The at least one coupling portion 235 may pass through the at least one coupling hole 215. For example, the at least one coupling portion 235 may protrude from the surface of the first member 201.

Figure 12:
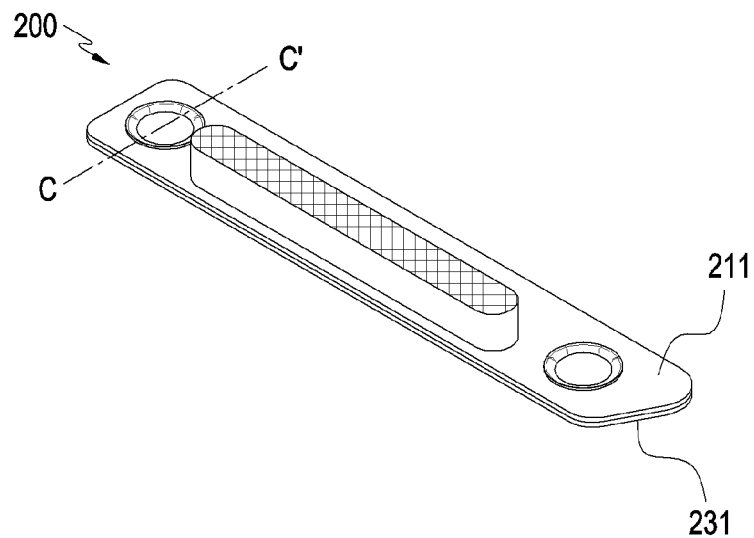
FIG. 12 is a perspective view showing a state in which a first member and a second member of a decoration structure included in an electronic device are fixed by a coupling portion, according to another one of various embodiments of the disclosure.
Figure 13:
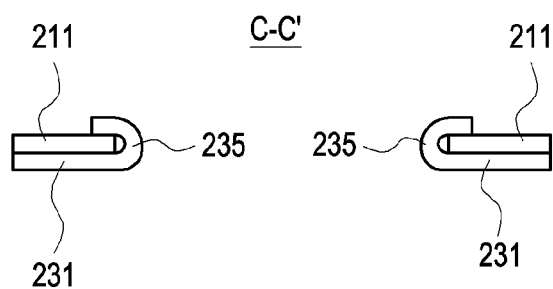
FIG. 13 is a cross-sectional view cut along a line C-C' of FIG. 12.

FIG. 12 is a perspective view showing a state in which a first member and a second member of a decoration structure included in an electronic device are fixed by a coupling portion, according to another one of various embodiments of the disclosure. FIG. 13 is a cross-sectional view cut along a line C-C' of FIG. 12.

Referring to FIGS. 12 and 13, the at least one coupling portion 235 may be bent by an external force, while protruding from the surface of the first member 201. As the at least one coupling portion 235 is bent on the surface of the first member 201, the at least one coupling portion 235 may couple the first member 201 with the second member 203.

Figure 14:
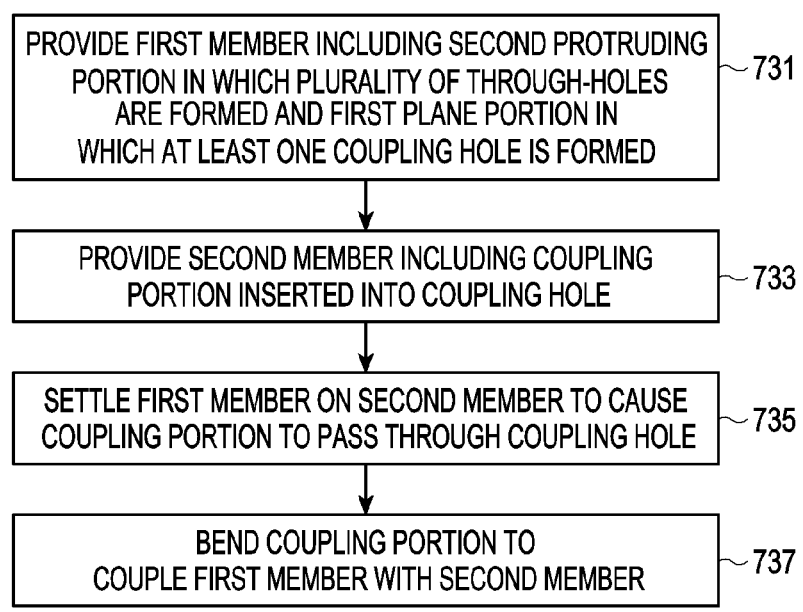
FIG. 14 is a flowchart illustrating a method of manufacturing a decoration structure included in an electronic device, according to another one of various embodiments of the disclosure.

FIG. 14 is a flowchart illustrating a method of manufacturing a decoration structure included in an electronic device, according to another one of various embodiments of the disclosure.

Referring to FIG. 14, a method of manufacturing a decoration structure included in an electronic device according to another one of various embodiments of the disclosure may include operation 731 of providing a first member (e.g., the first member 201 of FIG. 8) in which a second protruding portion, a plurality of through-holes, and at least one coupling portion (e.g., the coupling hole 215 of FIG. 8) are formed, operation 733 of providing a second member (e.g., the second member 203 of FIG. 8) including a first protruding portion and a coupling portion (e.g., the coupling portion 235 of FIG. 8) inserted into the coupling hole (e.g., the coupling hole 215 of FIG. 8), operation 735 of settling the first member (e.g., the first member 201 of FIG. 8) on the second member (e.g., the second member 203 of FIG. 8) to cause the coupling portion (e.g., the coupling portion 235 of FIG. 8) to pass through the coupling hole (e.g., the coupling hole 215 of FIG. 8), and operation 737 of bending the coupling portion (e.g., the coupling portion 235 of FIG. 8) to couple the first member (e.g., the first member 201 of FIG. 8) with the second member (e.g., the second member 203 of FIG. 8).

According to an embodiment of the disclosure, operation 731 of providing the first member (e.g., the first member 201 of FIG. 8) in which the plurality of through-holes and the at least one coupling hole (e.g., the coupling hole 215 of FIG. 8) are formed may include operation 731*a* of performing water-repellent coating on a surface of the first member (e.g., the first member 201 of FIG. 8), operation 731*c* of painting the surface of the first member (e.g., the first member 201 of FIG. 8) using deposition, and operation 731*e* of forming a second protruding portion (e.g., the second protruding portion 213 of FIG. 8) by pressing the first member (e.g., the first member 201 of FIG. 8). According to an embodiment of the disclosure, the method may further include an operation of wrapping the surface of the first member 213 by using a protection member prior to operation 731e of forming the second protruding portion (e.g., the first member 213 of FIG. 8) by pressing the first member (e.g., the first member 201 of FIG. 8).

According to an embodiment of the disclosure, operation 733 of providing the second member (e.g., the second member 203 of FIG. 8) including a coupling portion inserted into the coupling hole (e.g., the coupling hole 215 of FIG. 8) may include operation 733a of performing water-repellent coating on a surface of the second member (e.g., the second member 203 of FIG. 8), operation 733c of painting a surface of the second member (e.g., the second member 203 of FIG. 8) using deposition, etc., and operation 733e of forming a first protruding portion (e.g., the first protruding portion 233 of FIG. 8) by pressing the second member (e.g., the second member 203 of FIG. 8).

Figure 15:
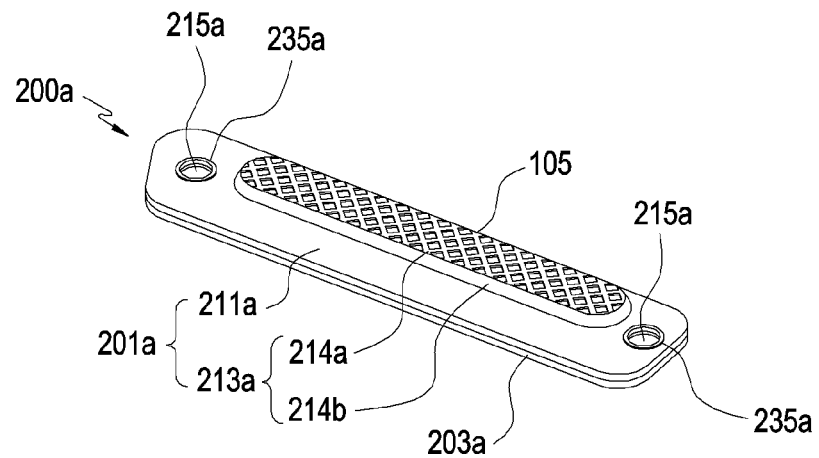
FIG. 15 is a perspective view illustrating a decoration structure included in an electronic device, according to yet another one of various embodiments of the disclosure.

FIG. 15 is a perspective view illustrating a decoration structure included in an electronic device (e.g., the electronic device 11 of FIG. 2), according to yet another one of various embodiments of the disclosure.

Referring to FIG. 15, a decoration structure 200a included in an electronic device (e.g., the electronic device 11 of FIG. 2) according to yet another one of various embodiments of the disclosure may include a first member 201a and a second member 203a.

According to an embodiment of the disclosure, the first member 201a may include a first plane portion 211a and a second protruding portion 213a. In the first plane portion 211a, a plurality of through-holes and at least one coupling hole 215a may be formed. The second protruding portion 213a may protrude from the first plane portion 211a while extending from the first plane portion 211a. A plurality of through-holes may be formed in a front surface 214a of the second protruding portion 213a. A side 214b of the second protruding portion 213a may be closed. For example, a plurality of through-holes may not be formed in the side 214b. According to an embodiment of the disclosure, the front surface 214a of the second protruding portion 213a may be subject to first laser processing by a laser along a first direction, such that a first portion of the second protruding portion 213a may be removed. The front surface 214a of the second protruding portion 213a may be subject to second laser processing by a laser along a second direction intersecting the first direction, such that a second portion of the second protruding portion 213a may be removed. In the front surface 131 of the second protruding portion 103, the plurality of through-holes 106 may be formed in a region where the first portion and the second portion removed by the laser intersect. According to an embodiment of the disclosure, a front surface of the first member 201a, e.g., a surface of the first plane portion 211a and the front surface 214a of the second protruding portion 213a may have a mesh form.

According to an embodiment of the disclosure, the second member 203a may reinforce the rigidity of the first member 201a while supporting the first member 201a. The second member 203a may include aluminum, stainless steel, etc. The second member 203a may include at least one coupling portion 235a which is inserted into the at least one coupling hole 215a. As the at least one coupling portion 235a is bent on the surface of the first member 201a by passing through the at least one coupling hole 215a, the first member 201a and the second member 203a may be coupled with each other.

Figure 16:
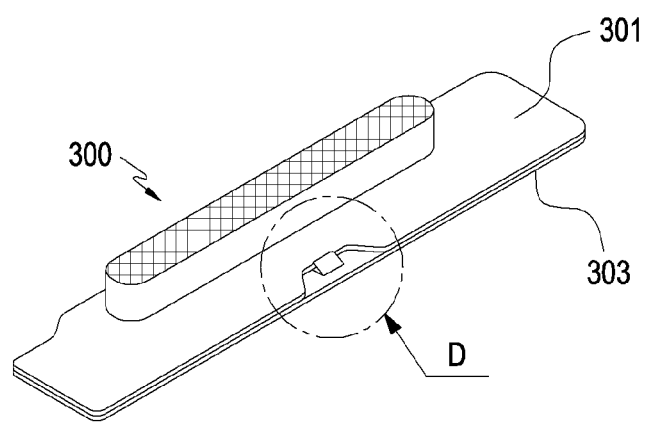
FIG. 16 is a perspective view illustrating a decoration structure included in an electronic device, according to yet one of various embodiments of the disclosure.
Figure 17:
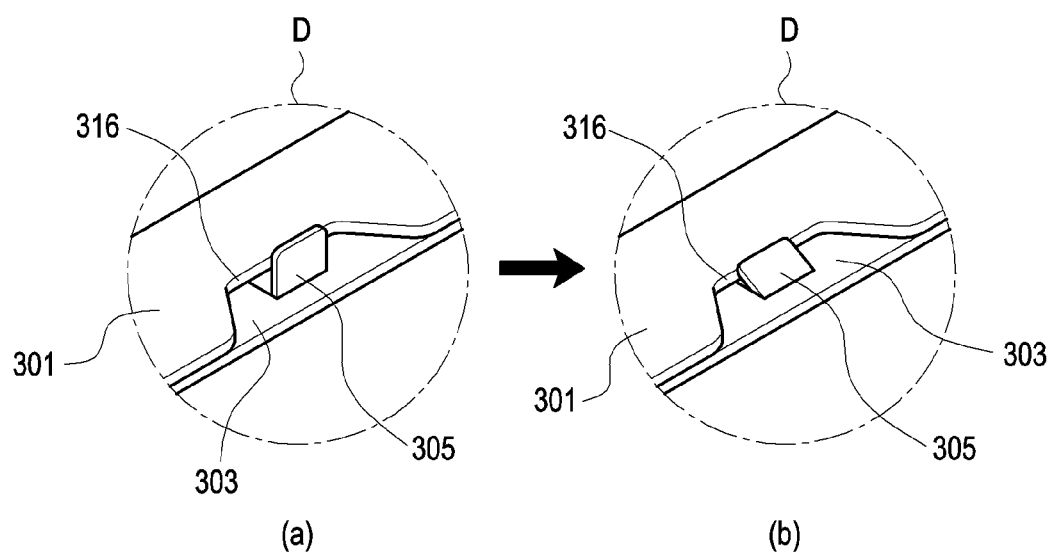
FIG. 17 is an enlarged view of a portion D illustrated in FIG. 16.

FIG. 16 is a perspective view illustrating a decoration structure included in an electronic device (e.g., the electronic device 11 of FIG. 2), according to yet another one of various embodiments of the disclosure. FIG. 17 is an enlarged view of a portion D illustrated in FIG. 16.

Referring to FIGS. 16 and 17, an electronic device (e.g., the electronic device 11 of FIG. 2) according to yet another one of various embodiments of the disclosure may include a first member 301 and a second member 303.

According to an embodiment of the disclosure, a plurality of through-holes may be formed in a surface of the first member 301. In the edge of the first member 301, an assembly structure 316 may be formed. The second member 303 may include at least one coupling portion 305 extending from the second member 303. The at least one coupling portion 305 may be bent by an external force and be locked by the assembly structure 316. As the at least one coupling portion 305 is locked by the assembly structure 316, the first member 301 and the second member 303 may be coupled with each other.

Figure 18:
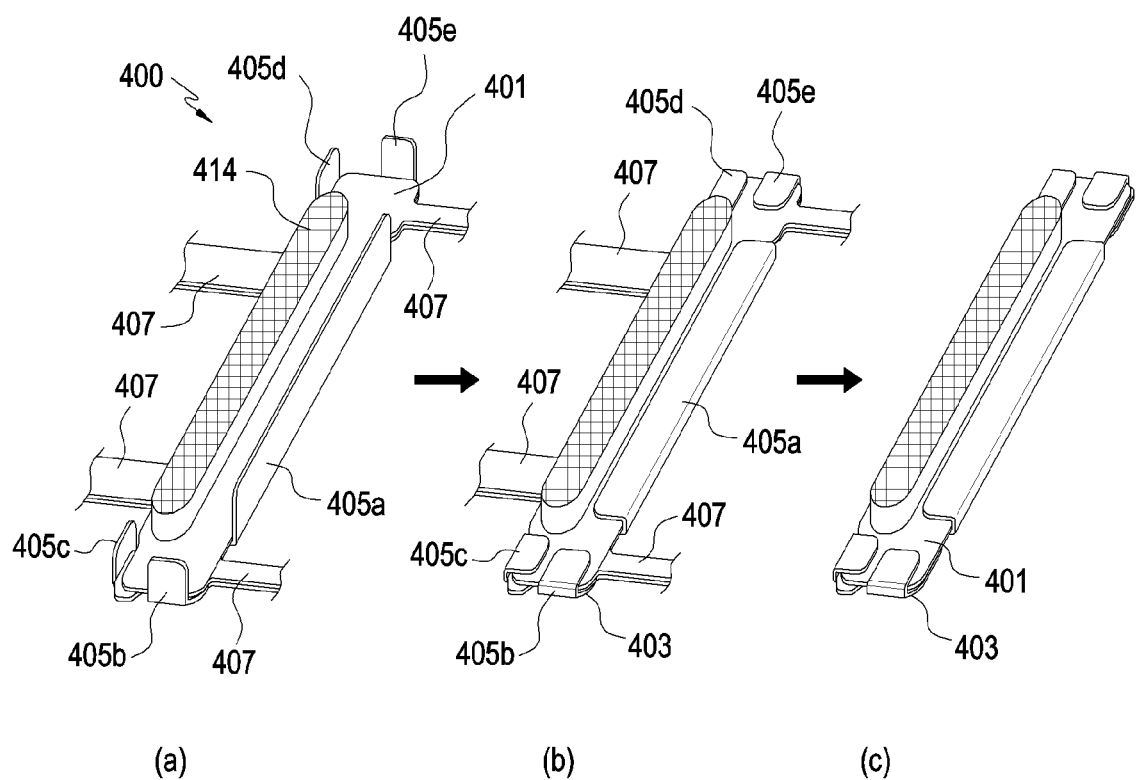
FIG. 18 is a perspective view showing a process in which a first member and a second member of a decoration structure included in an electronic device are coupled, according to yet another one of various embodiments of the disclosure.

FIG. 18 is a perspective view showing a process in which a first member and a second member of a decoration structure included in an electronic device (e.g., the electronic device 11 of FIG. 2) are coupled, according to yet another one of various embodiments of the disclosure.

Referring to FIG. 18, a decoration structure 400 included in an electronic device (e.g., the electronic device 11 of FIG. 2) according to yet another one of various embodiments of the disclosure may include a first member 401 and a second member 403.

According to an embodiment of the disclosure, the second member 403 may include at least one of coupling portions 405a, 405b, 405c, 405d, and 405e that are arranged along an edge of the first member 401 while extending from the second member 403. The at least one of coupling portions 405a, 405b, 405c, 405d, and 405e may be bent from the edge of the first member 401 and may be locked in the edge of the first member 401. As the at least one of coupling portions 405a, 405b, 405c, 405d, and 405e are locked in the edge of the first member 401, the first member 401 and the second member 403 may be coupled with each other.

According to an embodiment of the disclosure, the second member 403 may include fixing portions 407 extending from the second member 403. In a process of coupling the first member 401 with the second member 403, the fixing portion 407 may fix the second member 403. After the first member 401 is coupled with the second member 403, the fixing portion 407 may be removed from the second member 403.

Figure 19:
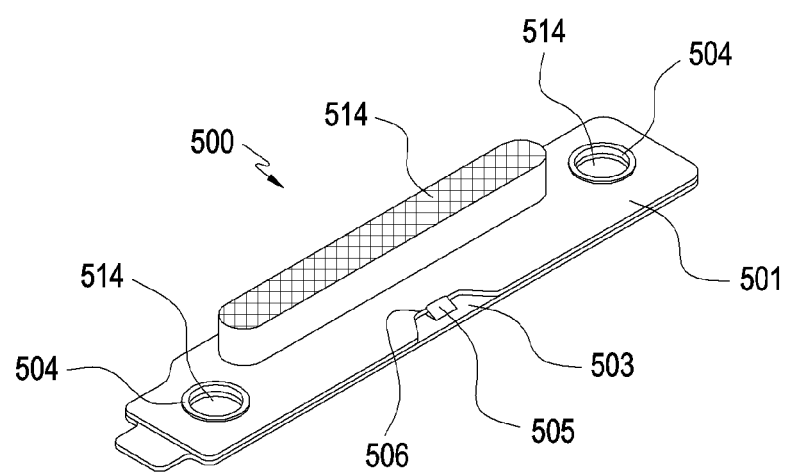
FIG. 19 is a perspective view illustrating a decoration structure included in an electronic device, according to yet another one of various embodiments of the disclosure.

FIG. 19 is a perspective view illustrating a decoration structure included in an electronic device (e.g., the electronic device 11 of FIG. 2), according to yet another one of various embodiments of the disclosure.

Referring to FIG. 19, a decoration structure 500 included in an electronic device (e.g., the electronic device 11 of FIG. 2) according to yet another one of various embodiments of the disclosure may include a first member 501 and a second member 503.

According to an embodiment of the disclosure, the first member 501 may include at least one coupling hole 514 and an assembly structure 506. The second member 503 may include a plurality of coupling portions 504 and 505. The plurality of coupling portions 504 and 505 may extend from the second member 503. The plurality of coupling portions 504 and 505 may include at least one first coupling portion 504 and at least one second coupling portion 505. The at least one first coupling portion 504 may be bent by being inserted into the at least one coupling hole 514. The at least one second coupling portion 505 may be bent in the assembly structure 506 and be locked by the assembly structure 506. As the at least one first coupling portion 504 is bent and is locked in the first member 501, the at least one second coupling portion 505 is also bent and locked in the assembly structure 506, such that the plurality of coupling portions 504 and 505 may couple the first member 501 with the second member 503.

Figure 20:
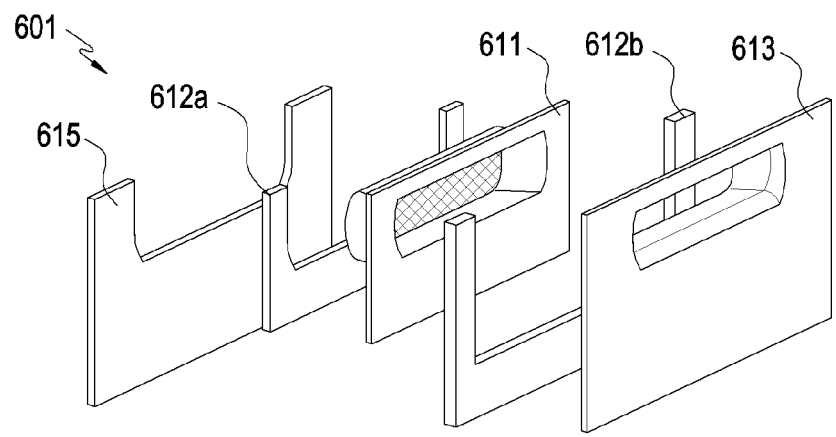
FIG. 20 is an exploded perspective view illustrating a decoration structure included in an electronic device, according to yet one of various embodiments of the disclosure.
Figure 21:
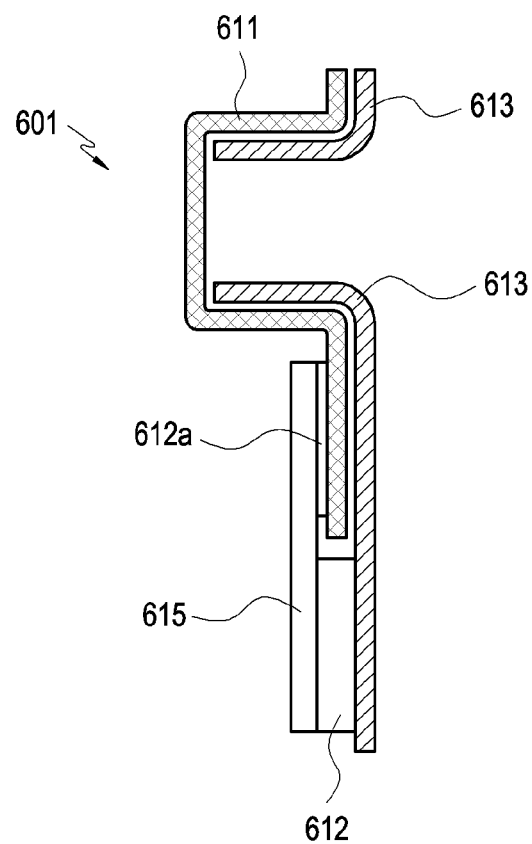
FIG. 21 is a cross-sectional view illustrating a decoration structure included in an electronic device, according to yet one of various embodiments of the disclosure.

FIG. 20 is an exploded perspective view illustrating a decoration structure included in an electronic device (e.g., the electronic device 11 of FIG. 2), according to yet another one of various embodiments of the disclosure. FIG. 21 is a cross-sectional view illustrating a decoration structure included in an electronic device, according to yet one of various embodiments of the disclosure.

Referring to FIGS. 20 and 21, a decoration structure 601 included in an electronic device (e.g., the electronic device 11 of FIG. 2) according to yet another one of various embodiments of the disclosure may include a first member 611 including a plurality of through-holes, a second member 613, and a fixing member 615.

According to an embodiment of the disclosure, the first member 611 may be attached to the fixing member 615 by a first adhesive member 612a. For example, the first adhesive member 612a may be a double-sided tape. According to an embodiment of the disclosure, the first adhesive member 612a may be a glue. The second member 613 may be attached to the fixing member 615 by a second adhesive member 612b. The second adhesive member 612b may be a double-sided tape. According to an embodiment of the disclosure, the first adhesive member 612b may be a glue. As the fixing member 615 is attached to the first member 611 and the second member 613, respectively, by using the first adhesive member 612a and the second adhesive member 612b, the first member 611 may be arranged between the fixing member 614 and the second member 613 and a coupling state between the first member 611 and the second member 613 may be maintained without using a separate adhesive member therebetween.

Figure 22:
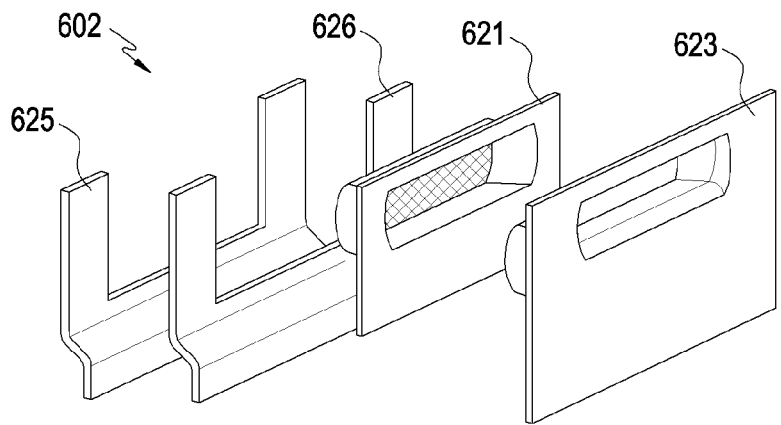
FIG. 22 is an exploded perspective view illustrating a decoration structure included in an electronic device, according to yet another one of various embodiments of the disclosure.
Figure 23:
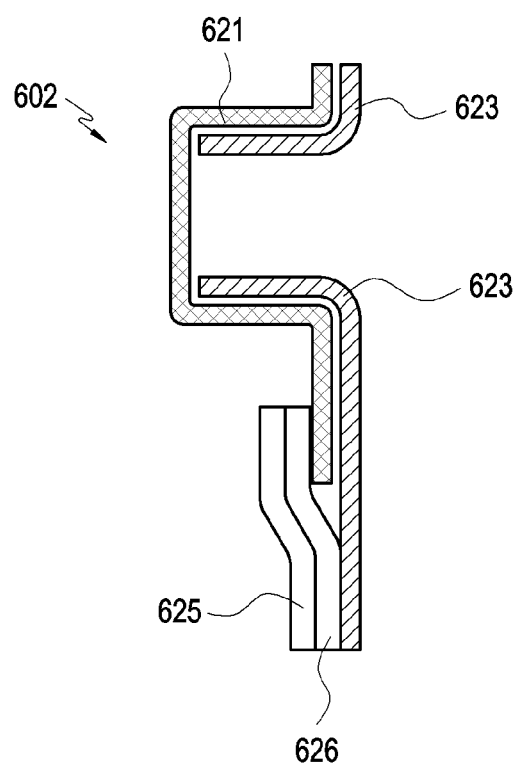
FIG. 23 is a cross-sectional view illustrating a decoration structure included in an electronic device, according to yet one of various embodiments of the disclosure.

FIG. 22 is an exploded perspective view illustrating a decoration structure included in an electronic device (e.g., the electronic device 11 of FIG. 2), according to yet another one of various embodiments of the disclosure. FIG. 23 is a cross-sectional view illustrating a decoration structure included in an electronic device, according to yet one of various embodiments of the disclosure.

Referring to FIGS. 20 and 21, a decoration structure 601 included in an electronic device (e.g., the electronic device 11 of FIG. 2) according to yet another one of various embodiments of the disclosure may include a first member 611 including a plurality of through-holes, a second member 613, and a fixing member 615.

According to an embodiment of the disclosure, the first member 621 may be arranged between the fixing member 626 and the second member 623. The fixing member 626 may include a first portion facing the first member 621 and a second portion facing the second member 623. The second portion may be bent with respect to the first portion. As the second portion of the fixing member 626 contacts the second member 621, the second portion may be attached to the second member 621 through ultrasonic fusion. As the fixing member 626 is attached to the second member 623, the first member 621 may maintain a fixed state between the fixing member 626 and the second member 623.

Figure 24:
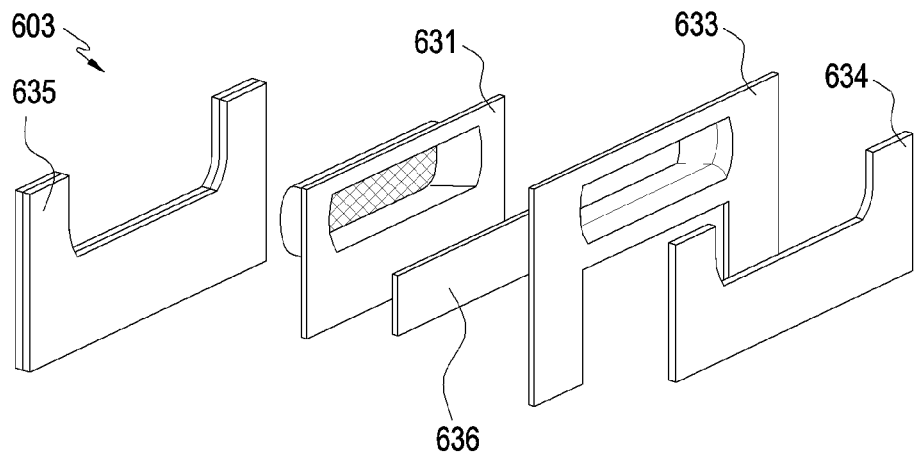
FIG. 24 is an exploded perspective view illustrating a decoration structure included in an electronic device, according to yet another one of various embodiments of the disclosure.
Figure 25:
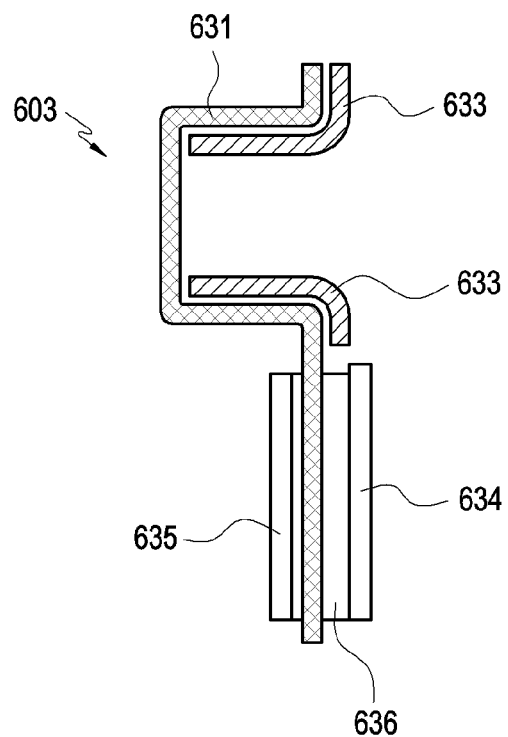
FIG. 25 is a cross-sectional view illustrating a decoration structure included in an electronic device, according to yet one of various embodiments of the disclosure.

FIG. 24 is an exploded perspective view illustrating a decoration structure included in an electronic device (e.g., the electronic device 11 of FIG. 2), according to yet another one of various embodiments of the disclosure. FIG. 25 is a cross-sectional view illustrating a decoration structure included in an electronic device, according to yet one of various embodiments of the disclosure.

Referring to FIGS. 24 and 25, a decoration structure 603 included in an electronic device (e.g., the electronic device 11 of FIG. 2) according to yet another one of various embodiments of the disclosure may include a first member 631 including a plurality of through-holes, a second member 633, and an attachment member 634.

According to an embodiment of the disclosure, the second member 633 may be attached to the attachment member 634. The first member 631 may be attached to the attachment member 634. As the second member 633 is arranged between the first member 631 and the attachment member 634, the second member 633 may support the first member 631.

According to an embodiment of the disclosure, the decoration structure 603 may include a compensation member 636. The compensation member may be filled in a space between the first member 631 and the attachment member 634.

According to an embodiment of the disclosure, the decoration structure 603 may include a protection member 635. The protection member 635 may prevent a bottom surface of the first plate (e.g., the first plate 12a of FIG. 2) from being damaged by the first member 631.

As such, an electronic device according to various embodiments of the disclosure may include a housing including a first plate, a second plate facing away from the first plate, and a side member surrounding a space between the first plate and the second plate, the side member being attached to or formed integrally with the second plate, a touch screen display exposed through the first plate, an audio component arranged between the first plate and the second plate and configured to output sound to outside from the housing through an opening formed in the first plate close to the touch screen display when viewed from above the first plate, a decoration structure including a first plane portion interposed between the audio component and the first plate and a second protruding portion protruding from a middle region of the first plane portion to fill the opening and formed integrally with the first plane portion, in which the second protruding portion includes an upper portion that is parallel with the first plate and a side that is substantially perpendicular to the upper portion, and the second protruding portion is connected with the first plane portion, and the upper portion includes a lattice structure including a plurality of through-holes and the side does not include a lattice structure, a wireless communication circuit arranged inside the housing, and a processor electrically connected to the touch screen display, the audio component, and the wireless communication circuit.

According to an embodiment of the disclosure, the first plane portion and the second protruding portion may include an identical metal material.

According to an embodiment of the disclosure, the metal material may include at least one of aluminum or stainless steel.

According to an embodiment of the disclosure, a side of the lattice structure may be exposed to an uppermost portion of the side.

A decoration structure included in an electronic device according to various embodiments of the disclosure may include a first plane portion, a second protruding portion connected with the first plane portion and protruding from a surface of the first plane portion, and a plurality of through-holes formed on a front surface of the second protruding portion in which a through-hole is not formed in a side of the second protruding portion.

According to an embodiment of the disclosure, the decoration structure may further include a plurality of recessed portions in an edge of the front surface of the second protruding portion.

According to an embodiment of the disclosure, the front surface of the second protruding portion may have a mesh form.

According to an embodiment of the disclosure, the plurality of through-holes may provide a path for discharging sound generated from inside the electronic device to outside the electronic device.

According to an embodiment of the disclosure, the second protruding portion may be formed by pressing the first plane portion using a pressing mold, the plurality of through-holes may be formed on the front surface of the second protruding portion, and the front surface of the second protruding portion may be treated using polishing, anodizing, and water-repellent coating.

A decoration structure included in an electronic device according to various embodiments of the disclosure may include a first member including a second protruding portion in which a plurality of through-holes are formed and a first plane portion in which at least one coupling hole is formed and a second member supporting the first member and including at least one coupling portion inserted into the at least one coupling hole, in which the at least one coupling portion is bent while being inserted into the at least one coupling hole to couple the first member with the second member.

According to an embodiment of the disclosure, the at least one coupling portion may protrude from a surface of the second member.

According to an embodiment of the disclosure, the at least one coupling portion may have a shape corresponding to the at least one coupling hole.

According to an embodiment of the disclosure, the second member may include a first protruding portion corresponding to the second protruding portion and a second plane portion corresponding to the first plane portion and including the at least one coupling portion.

According to an embodiment of the disclosure, a first surface of the first member may have a mesh form.

According to an embodiment of the disclosure, the decoration structure may further include a protection member covering the first surface of the first member.

According to an embodiment of the disclosure, the first member may be settled on the second member, the at least one coupling portion of the second member may pass through the coupling hole of the first member, and the at least one coupling portion may be bent to couple the first member with the second member. A front surface of the second protruding portion may be treated using polishing, anodizing, and water-repellent coating.

According to an embodiment of the disclosure, the plurality of through-holes may be formed on the front surface of the second protruding portion, and a through-hole may not be formed in a side of the second protruding portion and the first plane portion.

According to an embodiment of the disclosure, the plurality of through-holes may be formed in the front surface of the second protruding portion through laser processing.

According to an embodiment of the disclosure, the at least one coupling portion may be bent in an edge of the first member to couple the first member with the second member.

While embodiments of the present disclosure have been described, it would be obvious to those of ordinary skill in the art that various changes may be made without departing the scope of the present disclosure.

What is claimed is:

1. An electronic device comprising:
    a housing comprising a first plate, a second plate facing away from the first plate, and a side member surrounding a space between the first plate and the second plate, the side member being attached to or formed integrally with the second plate;
    a touch screen display viewable through the first plate;
    an audio component arranged between the first plate and the second plate and configured to output sound to outside the housing through an opening formed in the first plate close to the touch screen display when viewed from above the first plate;
    a decoration structure, comprising:
        a first member including a first plane portion interposed between the audio component and the first plate, wherein the first plane portion includes at least one coupling hole, and a second protruding portion protruding from a middle region of the first plane portion to fill the opening and formed integrally with the first plane portion and
        a second member supporting the first member, wherein
    the second protruding portion comprises an upper portion that is parallel with the first plate and a side portion that is substantially perpendicular to the upper portion, and the second protruding portion is connected with the first plane portion, and the upper portion comprises a lattice structure comprising a plurality of through-holes and the side portion does not comprise a lattice structure, and
    the second member comprises a second plane portion corresponding to the first plane portion, a first protruding portion corresponding to the second protruding portion, and at least one coupling portion extended from the second plane portion and inserted into the at least one coupling hole.

2. The electronic device of claim 1, wherein the first plane portion and the second protruding portion comprise an identical metal material.

3. The electronic device of claim 2, wherein the metal material comprises at least one of aluminum or stainless steel.

4. The electronic device of claim 1, wherein a side of the lattice structure is exposed to an uppermost portion of the side.

* * * * *